United States Patent [19]

Swift et al.

[11] 4,445,111

[45] Apr. 24, 1984

[54] BI-POLAR ELECTRONIC SIGNAL CONVERTERS WITH SINGLE POLARITY ACCURATE REFERENCE SOURCE

[75] Inventors: Steven D. Swift; Jonathan J. Parle, both of Seattle; David A. Gunderson, Everett, all of Wash.

[73] Assignee: John Fluke Mfg. Co., Inc., Everett, Wash.

[21] Appl. No.: 187,442

[22] Filed: Sep. 15, 1980

[51] Int. Cl.$^3$ ............................................. H03K 13/02
[52] U.S. Cl. ........................ 340/347 CC; 340/347 NT; 340/347 C; 340/347 AD; 340/347 DA; 324/130
[58] Field of Search ..... 340/347 CC, 347 C, 347 NT, 340/347 AD, 347 DA; 324/99 D, 130

[56] References Cited

U.S. PATENT DOCUMENTS

| | | | |
|---|---|---|---|
| 3,105,230 | 9/1963 | MacIntyre | 340/347 C |
| 3,540,037 | 11/1970 | Ottesen | 340/347 C |
| 3,577,138 | 5/1971 | Kawashima et al. | 340/347 |
| 3,581,304 | 5/1971 | Paradise et al. | 340/347 |
| 3,737,893 | 6/1973 | Belet et al. | 340/347 NT |
| 3,749,894 | 7/1973 | Avdeef | 235/150.52 |
| 3,895,376 | 7/1975 | Uchida | 340/347 NT |
| 3,942,174 | 3/1976 | Dorey et al. | 340/347 NT |
| 3,943,506 | 3/1976 | Peattie | 340/347 NT |
| 3,978,471 | 8/1976 | Kelly | 340/347 NT |
| 4,074,257 | 2/1978 | Henry | 340/347 NT |
| 4,082,998 | 4/1978 | Marriott | 324/99 D |

FOREIGN PATENT DOCUMENTS 2814754 10/1978 Fed. Rep. of Germany ...... 340/347 DA
772714 4/1957 United Kingdom ............ 340/347 C

OTHER PUBLICATIONS

Rullgard, "IBM Technical Disclosure Bulletin", vol. 10, No. 1, Jun. 1967, pp. 5-6.
Schulz, "IBM Technical Disclosure Bulletin", vol. 16, No. 1, Jun. 1973, pp. 137-138.

*Primary Examiner*—C. D. Miller
*Attorney, Agent, or Firm*—Gary S. Kindness; Stephen A. Becker; Mikio Ishimaru

[57] ABSTRACT

Bi-polar electronic signal converters, such as analog-to-digital or digital-to-analog converters, with a single polarity accurate reference source are disclosed. In one polarity direction, the accurate reference source is used in a conventional manner to transform the signal to be converted from one form (e.g., analog) to the other form (e.g., digital). In the other polarity direction, an inaccurate reference source is used in a similar conventional manner to convert the signal from one form to the other form. Periodically, the accurate and the inaccurate reference sources are compared to determine a correction multiplier. The correction multiplier is used during conversions using the inaccurate reference source to compensate for the inaccuracy of the inaccurate reference source.

7 Claims, 4 Drawing Figures

BI-POLAR ELECTRONIC SIGNAL CONVERTERS WITH SINGLE POLARITY ACCURATE REFERENCE SOURCE

TECHNICAL AREA

This invention is directed to electronic signal converters and, more particularly, to bi-polar signal converters for converting signals from one form into another form using reference sources of both positive and negative polarity.

BACKGROUND OF THE INVENTION

Many electronic converters convert bi-polar signals from one form to another form using reference sources of both positive and negative polarity. For example, a dual slope, ratiometric type, analog-to-digital (A/D) converter converts bi-polar analog signals into digital signals by comparing the analog signal to be converted to a reference source of polarity opposite to the polarity of the analog signal and using the results of the comparison to produce the digital equivalent of the analog signal. The comparison is accomplished by using the magnitude of the analog signal to control the rate of charging of the capacitor of an integrator for a known period of time. Thereafter, the integrator charge is dissipated at a rate controlled by the magnitude of an accurate reference source. The period of time required to discharge the capacitor to a predetermined level, usually zero, is directly related to the magnitude of the analog signal. The time period is usually measured by enabling a counter to count clock pulses during the discharge or deintegrate period of time. The number of pulses counted is, thus, the digital equivalent of the magnitude of the analog signal.

Another example of an electronic converter requiring reference sources of both positive and negative polarity is a bi-polar digital-to-analog (D/A) converter. In such a converter a reference source is connected to charge a capacitor at a rate related to the magnitude of the reference source for a period of time related to the value of the digital signal to be converted. The polarity of the reference source, of course, is related to the sign (+ or −) of the digital signal.

In the past, bi-polar electronic converters have usually required the inclusion of two accurate reference sources, one of positive polarity and the other of negative polarity. Depending on the nature of the converter, the reference sources have been either voltage sources or current sources. Regardless of their nature both reference sources were required to be highly accurate. In the case of voltage sources this usually meant the inclusion of a potentiometer for each source and its adjustment to achieve full-scale readings. Such a technique is costly because it requires two potentiometers and the labor required to adjust both potentiometers. An alternative technique for achieving two highly accurate reference voltage sources is to use a potentiometer to establish one reference voltage and a precision voltage divider to establish the second reference voltage. While this technique is less costly than a technique utilizing two potentiometers, it still requires precision matched components, which are relatively expensive. A still further technique is commonly referred to as the "flying" capacitor technique. In this technique a capacitor is charged by a single voltage reference. Analog switches are used to connect either the positive or negative terminals of the capacitor to the input of the converter and the other terminal to ground, when the reference source is needed. This technique, of course, requires accurate component selection and a series of analog switches. As a result, it is still more complicated and expensive than desirable. The present invention is directed to eliminating the need for a second accurate reference source entirely and, thus, entirely avoiding these and other such problems.

Therefore, it is an object of this invention to provide a new and improved bi-polar converter with a single polarity accurate reference source.

It is another object of this invention to provide a bi-polar ratiometric type electronic conversion system including only a single polarity accurate reference source.

It is a still further object of this invention to provide a bi-polar analog-to-digital converter with a single polarity accurate reference source.

It is yet another object of this invention to provide a bi-polar digital-to-analog converter that includes a single polarity accurate reference voltage source.

It is still yet another object of this invention to provide an electronic converter that can be used as a bi-polar analog-to-digital converter or a bi-polar digital-to-analog converter yet only includes a single polarity accurate reference source.

SUMMARY OF THE INVENTION

In accordance with this invention, a bi-polar electronic converter with a single polarity accurate reference source is disclosed. In one polarity direction, the accurate reference source is used in a conventional manner to transform the signal to be converted from one form (e.g., analog) to the other form (e.g., digital). In the other polarity direction, an inaccurate reference source is used in a similar conventional manner to convert the signal from one form to the other form. Periodically, the accurate reference source is compared to the inaccurate reference source to determine a correction multiplier. The correction multiplier is used during conversion using the inaccurate reference source to compensate for the inaccuracy of the inaccurate reference source.

In accordance with further features of this invention, the electronic converter is a dual slope, ratiometric type, analog-to-digital (A/D) converter; and, the accurate and inaccurate reference sources are voltage sources.

In accordance with other features of this invention, the electronic converter can function either as a bi-polar analog-to-digital or a bi-polar digital-to-analog converter; and, the accurate and inaccurate reference sources are voltage sources.

As will be readily appreciated from the foregoing description, the invention provides new and improved bi-polar electronic converters that only require a single accurate reference source, yet provide accurate conversions in both polarity directions. While the invention was developed primarily for use in analog-to-digital (A/D) converters of the dual slope type, the invention can also be utilized in other types of bi-polar analog-to-digital converters, as well as bi-polar digital-to-analog converters, and other types of bi-polar electronic converters wherein voltage or current reference sources of both positive and negative polarity are required to provide accurate bi-polar conversion of an electronic signal from one form to another form. Thus, the invention is useful in a wide variety of electronic signal conversion systems.

BRIEF DESCRIPTION OF THE DRAWINGS

The foregoing objects and any of the attendant advantages of this invention will become more readily appreciated as the same becomes better understood by reference to the following detailed description when taken in conjunction with the accompanying drawings wherein.

DESCRIPTION OF THE PREFERRED EMBODIMENTS

Figure 1:
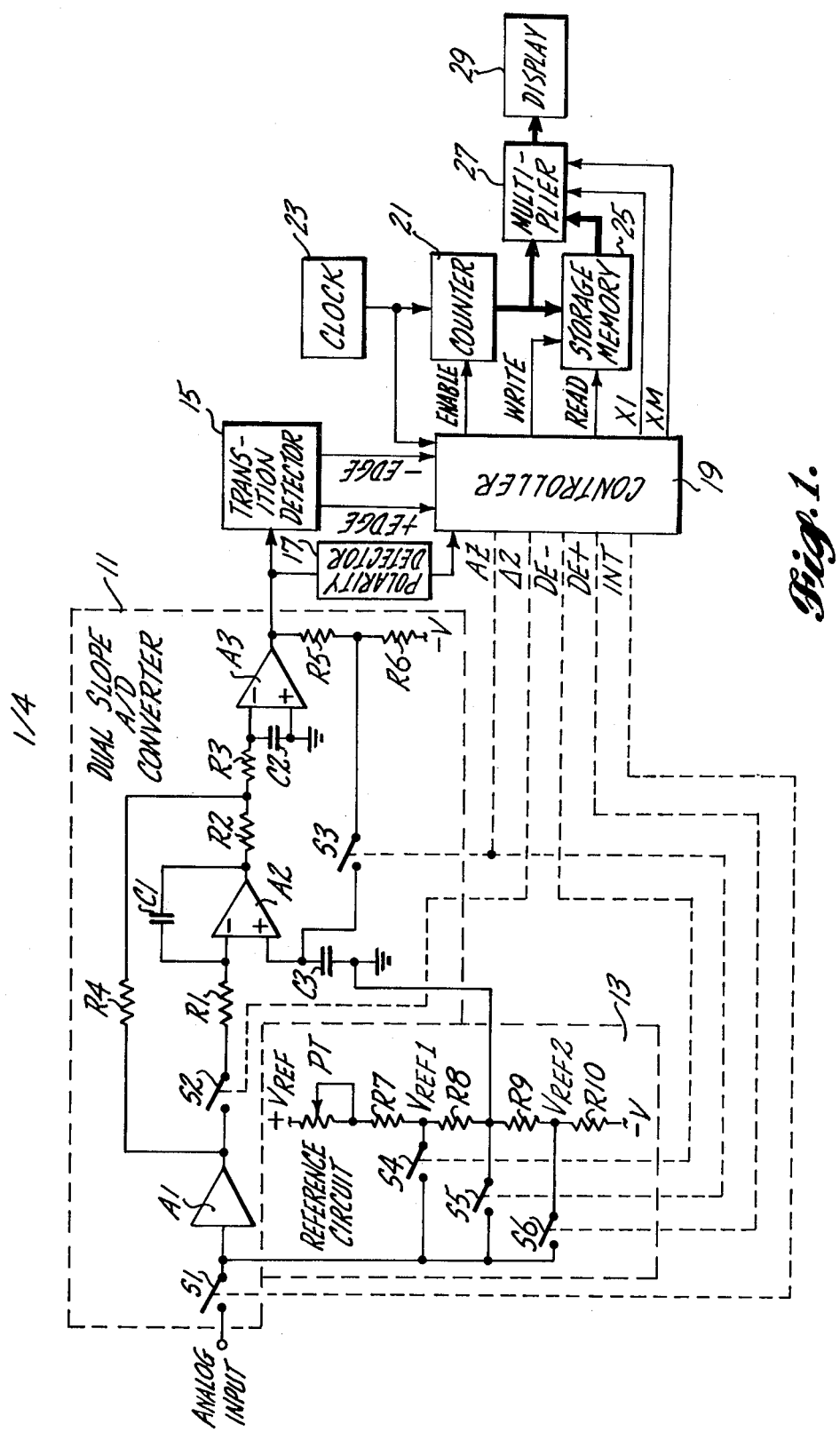
FIG. 1 is a partially block and partially schematic diagram of a dual slope analog-to-digital converter modified in accordance with the invention.
Figure 3:
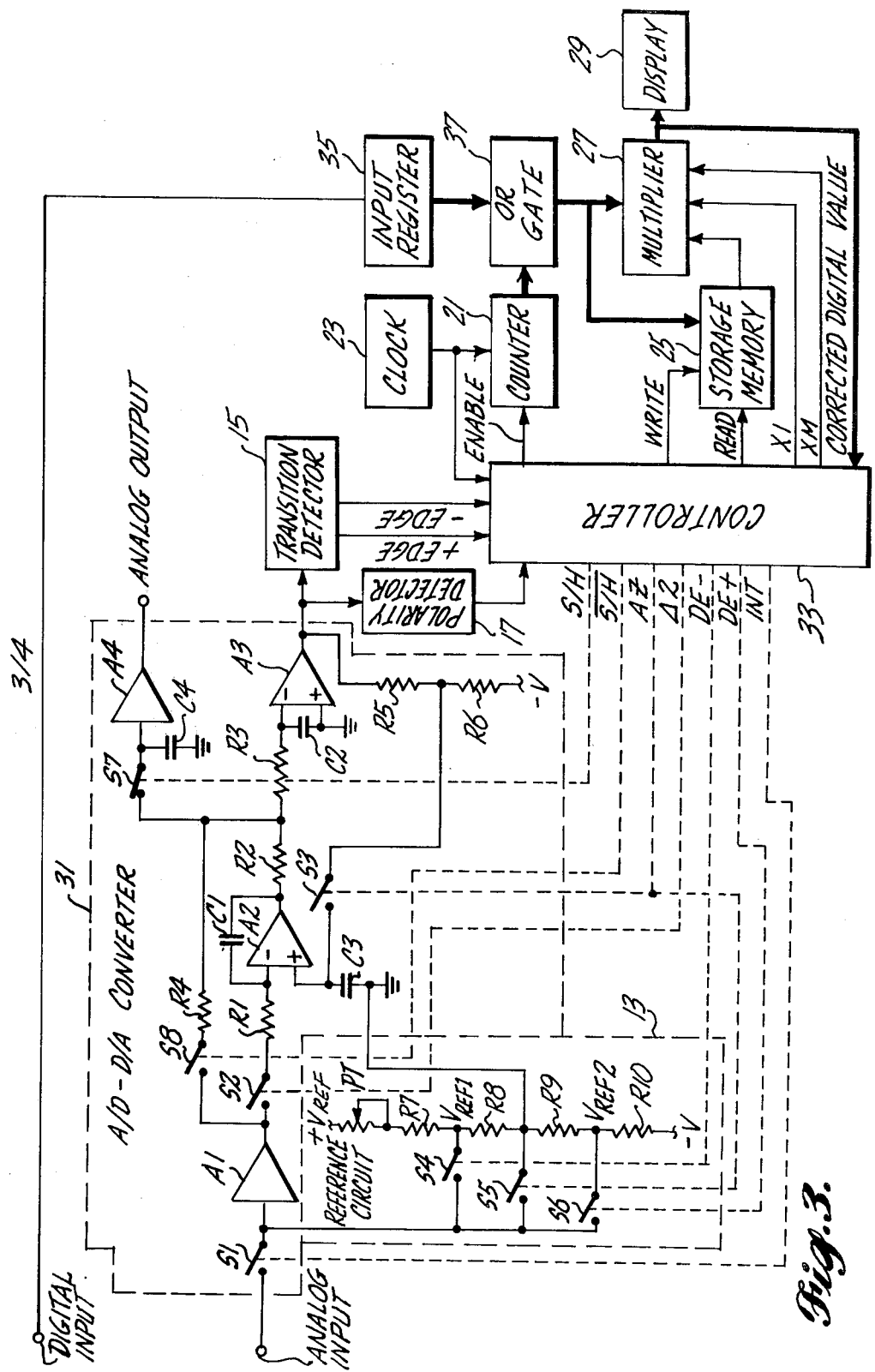
FIG. 3 is a partially block and partially schematic diagram similar to FIG. 1 modified to provide digital-to-analog conversion as well as analog-to-digital conversion; and, FIG. 4 is a flow diagram illustrating the operation of the controller illustrated in FIG. 3.

FIG. 1 illustrates, and the following description describes, the application of the invention to a dual slope A/D converter. However, it is to be understood that the invention can be applied to other types of electronic signal converters including other types of ratiometric A/D converters, as well as combined A/D and D/A converters, such as illustrated in FIG. 3 and hereinafter described. In general, the invention is useful in any electronic conversion system requiring highly accurate current or voltage reference sources of both positive and negative polarity.

FIG. 1 includes: a dual slope A/D converter 11; a reference circuit 13; a transition detector 15; a polarity detector 17; a controller 19; a counter 21; a clock 23; a storage memory 25; a multiplier 27; and, a display 29. The dual slope A/D converter 11 includes: a signal amplifier designated A1; a difference amplifier designated A2; a comparator designated A3; three single pole-single throw switches designated S1, S2 and S3; three capacitors designated C1, C2 and C3; and, six resistors designated R1, R2, R3, R4, R5 and R6. The reference circuit 13 includes: three single pole-single throw switches designated S4, S5 and S6; an adjustment potentiometer designated PT; and, four resistors designated R7, R8, R9 and R10. (While the single pole-single throw switches S1-S6 are illustrated as mechanical switches, it is to be understood that in an actual embodiment of the invention, preferably, these switches would take the form of semi-conductor switches.)

The analog signal to be converted is applied to one terminal of S1. The other terminal of S1 is connected to the input of A1. The output of A1 is connected to one terminal of S2 and the output of S2 is connected through R1 to the inverting input of A2. The output of A2 is connected through R2 in series with R3 to the inverting input of A3. The output of A2 is also connected through C1 to the inverting input of A2. The non-inverting input of A2 is connected through C3 to ground. The junction between R2 and R3 is connected through R4 to the output of A1. C2 is connected across the inverting and non-inverting inputs of A3. The non-inverting input of A3 is also connected to ground. The output of A3 is connected through R5 and R6 to a negative voltage source designated −V. The junction between R5 and R6 is connected to one terminal of S3. The other terminal of S3 is connected to the non-inverting input of A2, as well as C3.

As will be readily understood by those familiar with dual slope analog-to-digital converters, from FIG. 1 and the foregoing description, A1 is a signal amplifier that amplifies the analog input, when S1 is closed. A2 in combination with C1 and R1 form an integrator that integrates the output of A1, in one direction or the other depending upon its polarity, when S2 is closed. A3 compares the output of A2 with a predetermined reference voltage—ground in the illustrated converter. R2 and R4 are included to cause a minimum zero count reading to compensate for signal propagation delays through the circuit. (The minimum count is later subtracted from the digital output by means not shown.) C2 and R3 form a noise filter that prevents the erroneous tripping of A3. R5 and R6 form a signal divider.

One end of PT is connected to a positive reference source designated $+V_{REF}$. The wiper of PT is connected to the other terminal of PT. Further, the other terminal of PT is connected through R7 in series with R8, R9 and R10 in that order ot the negative voltage source designated −V. The junction between R8 and R9 is connected to ground. The junction between R7 and R8 is designated $V_{REF1}$ and is connected to one terminal of S4. The junction between R8 and R9 is also connected to one terminal of S5. The junction between R9 and R10 is designated $V_{REF2}$ and is connected to one terminal of S6. The other terminals of S4, S5 and S6 are connected together and to the input of A1.

As will be readily appreciated by those skilled in the electronics art and others from viewing FIG. 1 and the foregoing description, $V_{REF1}$ is a highly accurate positive reference voltage if the value of $+V_{REF}$ is accurately controlled. The actual value of $V_{REF1}$ is set, of course, by the adjustment of PT. Contrariwise, assuming −V is not a highly accurate voltage, $V_{REF2}$ is a relatively inaccurate negative reference voltage. In summary, $V_{REF1}$ is a highly accurate positive reference voltage and $V_{REF2}$ is a relatively inaccurate negative reference voltage.

The output of the comparator amplifier, A3, of the dual slope A/D converter is connected to the input of the transition detector 15 and to the input of the polarity detector 17. When the transition detector 15 detects a transition it produces an output pulse on one or the other of two output lines. If the transition is from positive to negative, an output is produced on an output line denoted −EDGE. Contrariwise, if the transition is from negative to positive, an output pulse is produced on the output line designated +EDGE. The outputs of the transition detector 15 are connected to inputs of the controller 19. The polarity detector 17 produces an output signal whose state is determined by the polarity on the output of the dual slope A/D converter 11. The output of the polarity detector is also connected to an input of the controller 19.

The counter 21 receives clock pulses from the clock 23. The clock pulses are also applied to the controller 19 for synchronization purposes. The counter 21 is enabled to count clock pulses by the state of an ENABLE output of the controller 19. The data output of the counter 21 is connected to the data input of the storage memory 25 and to the multiplier 27. While illustrated as a parallel data output, of course, the output of the counter 21 can be a serial data output. The storage memory 25 is also connected to the controller 19 to receive READ and WRITE control signals. The data output of the storage memory 25 is connected to an input of the multiplier 27. The multiplier 27 is connected to the controller 19 to receive control signals devoted X1 and XM. Finally, the data output of the multiplier 27 is connected to the data input of the display 29. (Preferably, the controller and the peripheral items connected thereto, such as the counter, storage memory, etc., will be formed by a microprocessor in an actual embodiment of the invention.)

In addition to the just described ENABLE, READ, WRITE, X1 and XM control signals, the controller 19 produces a plurality of switch control signals designated AZ, $\Delta 2$, DE−, DE+ and INT. AZ is applied to S3 and S5 and controls the state of S3 and S5. $\Delta 2$ is applied to S2 and controls the state of S2. DE− is applied to S4 and controls the state of S4. DE+ is applied to S6 and controls the state of S6; and, INT signal is applied to S1 and controls the state of S1.

Figure 2:
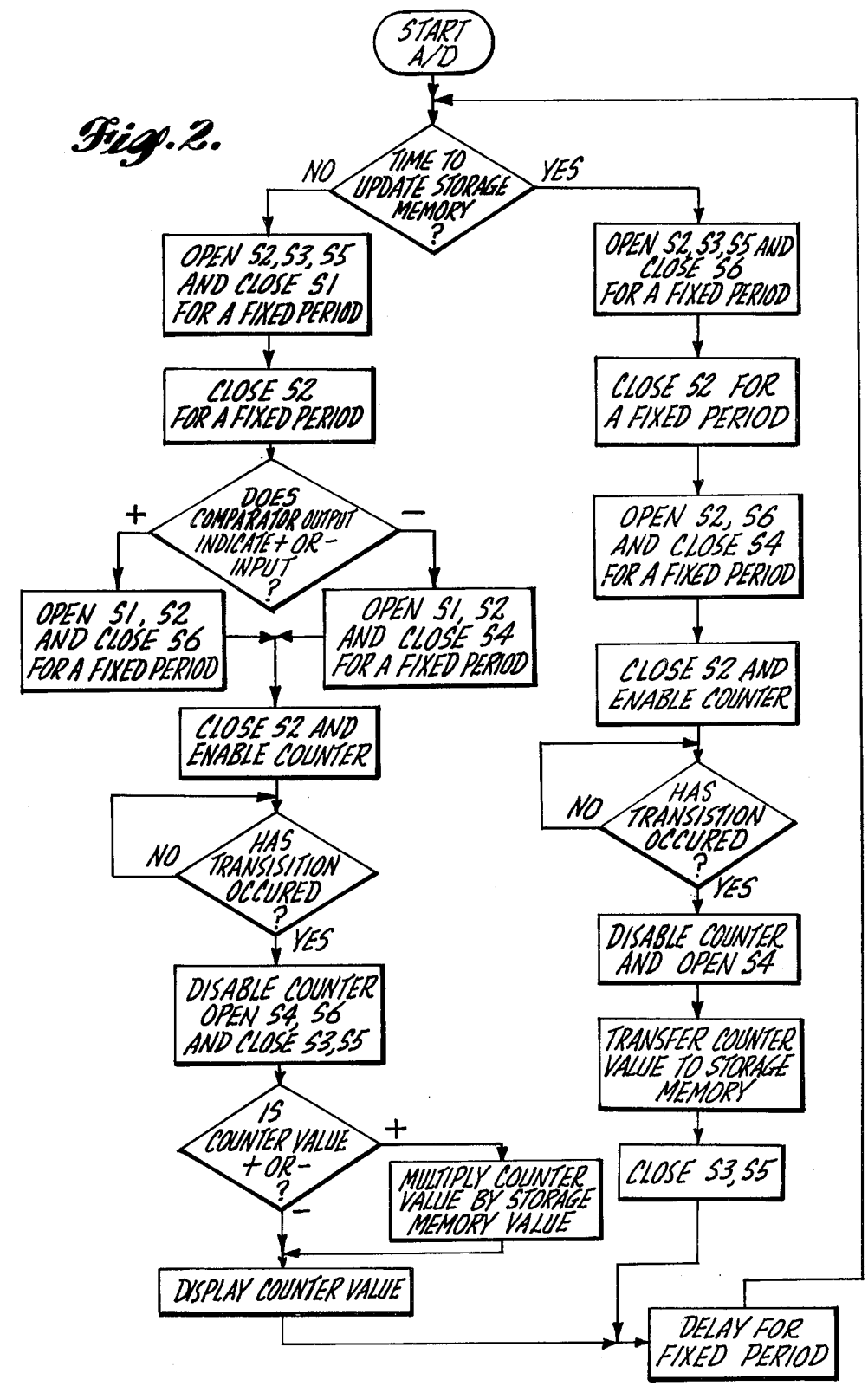
FIG. 2 is a flow diagram illustrating the operation of the controller illustrated in FIG. 1.

As will be better understood from the following description of FIG. 2, the controller 19 controls the operation of the dual slope A/D converter 11, the reference circuit 13, the counter 21 and the storage memory 25 such that, periodically, $V_{REF2}$ is compared with $V_{REF1}$ and the result of the comparison, which forms a correction multiplier, is stored in the storage memory. Thereafter, when $V_{REF2}$ is used during the conversion of an analog signal to a digital signal, the correction multiplier is used to correct the results of the conversion for the error caused by the inaccuracy of $V_{REF2}$. In addition, the controller 19 controls the operation of the dual slope A/D converter 11, the reference circuit 13 and the counter 21 in a conventional manner to cause dual slope A/D conversion. Finally, the controller 19 controls the multiplier 27 such that the output of the counter resulting from a conversion using $V_{REF1}$ is directly applied to the display 27 and the output of the counter resulting from a conversion using $V_{REF2}$ is multiplied by the stored correction multiplier and the result applied to the display 29.

FIG. 2 illustrates one sequence of operation of the controller 19 for achieving the foregoing results. The first step, after the controller is started (such as by the closure of a power on switch), is a test to determine if it is time for the storage memory 25 to be updated. As noted above, the storage memory is periodically updated, such as once every ten (10) conversion cycles, for example. Assuming it is not time to update the storage memory, the controller causes the AZ control signal to shift to a state that causes S3 and S5 to open. (S2, S3 and S5 are closed at the end of each sequence. All other switches are open.) Also at the same time the INT control signal shifts to a state that causes S1 to close. After a first fixed period of time (adequate for the output of A1 to settle to a stable level) has elapsed, the controller causes the $\Delta 2$ control signal to shift to a state that causes S2 to close, S1 remaining closed and all other switches remaining open. This state exists for a second fixed period of time. During this period of time, the integrator capacitor C1 is charged, in a polarity direction determined by the polarity of the analog input, to a value determined by the magnitude of the analog input. During the second fixed period of time, the controller 19 tests the output of the polarity detector 17 to determine if the output of the comparator amplifier A3 indicates that the analog input is positive (+) or negative (−). After the second fixed period of time has elapsed, the INT control signal shifts to a state that causes S1 to open. At the same time the $\Delta 2$ control signal shifts to a state that causes S2 to open. If the output of the comparator indicated that the analog input is negative, the DE− control signal causes S4 to close at the same time as S1 and S2 are opened by INT and $\Delta 2$, respectively. Alternatively, if the output of the comparator indicated that the analog input is positive the DE+ control signal causes S6 to close at the same time as S1 and S2 are opened by INT and $\Delta 2$, respectively. Regardless of which switch, S4 or S6, is closed, a voltage of polarity opposite to the polarity of the analog input is now applied to the input of A1. The switches remain in these states for a third fixed period of time adequate for the output of A1 to again settle. (During this period of time, the other two switches—S3 and S5—both remain open.)

Regardless of whether S4 or S6 is closed after the chosen settling period of time has elapsed, the controller shifts the $\Delta 2$ control signal to a state that causes S2 to again close. (S4 or S6, whichever is closed, remains closed.) At the same time that S2 is closed, the controller enables the counter 21 to count clock pulses produced by the clock 23. The integrator now starts to ramp in the opposite direction, i.e., to discharge. During the discharge period of time, the controller continuously monitors the output of the transition detector 15 to determined when the output of the comparator amplifier A3 passes through zero. When this transition occurs either a +EDGE or a −EDGE pulse is produced by the transition detector and the controller 19 immediately disables the counter 21. At the same time, the closed one of S4 and S6 is opened by the controller causing the appropriate DE− or DE+ control signal to change state. Also, at the same time, S3 and S5 are closed by the controller 19 causing the AZ control signal to change state. As a result of the last action, the dual slope A/D converter is placed in an auto-zero mode of operation.

The controller 19 next determines whether or not the counter value is a positive or a negative value. This decision is based on whether or not the transition detector produced a +EDGE pulse or a −EDGE pulse, which, as discussed above, is based on whether or not the converter output transition is from positive to negative or from negative to positive. If the counter value is negative because the analog input was negative, the controller knows that $V_{REF1}$ was used to discharge the integrator. Since $V_{REF1}$ is the highly accurate reference voltage no correction is necessary. As a result, the multiplier 27 is enabled by the controller producing an X1 control pulse. As a result of the X1 control pulse the multiplier 27 merely receives the output of the counter 21 and applies it unchanged to the display 29, i.e., the multiplier multiplies the output of the counter 21 by the numerical value one (1). Contrariwise, if the controller determines that the analog input was positive, whereby $V_{REF2}$ was used to discharge the integrator, the controller applies a READ control signal to the storage memory 25 causing the storage memory to produce the correction multiplier on its output. The correction multiplier is thus applied to the multiplier 27. At the same time the multiplier 27 is enabled by an XM control signal produced by the controller 19. The XM control signal causes the multiplier 27 to multiply the output of the counter 21 by the correction multiplier produced by the storage memory. The result of this digital multiplication is applied to the display 29. As noted above, multiplication by the correction multiplier compensates for the error caused by the inaccuracy of $V_{REF2}$.

In one or the other of the foregoing manners, a digital display value is applied to the display 29. Obviously, if the digital value is to be used by other electronic systems rather than, or in addition to, being displayed, the output of the multiplier is connected to such systems. After a fixed delay period, the system recycles, as illustrated in FIG. 2, and the time to update storage memory test reoccurs.

When the time to update storage memory test produces a yes result, the sequence of steps illustrated on the right side of FIG. 2, rather than the sequence illustrated on the left side, occurs. The first step in the sequence is the controller producing an AZ signal state change that causes S3 and S5 to open. At the same time, the DE+ signal changes state to switch S6 closed and the Δ2 signal changes state to switch S2 open. At this time, of course, INT is placed in a state that switches S1 open. S1 is maintained opened during the entire sequence of steps illustrated on the right side of FIG. 2, which are now being described.

After a first fixed period of time has elapsed, during which the output of A1 is settling, the controller causes the Δ2 signal to change state and close S2. S2 remains closed for a second fixed period of time. During this period of time, the integrating capacitor C1 is charged in a positive direction by $V_{REF2}$. (S6, of course, remains closed.) After the second fixed period of time has elapsed, the controller causes the DE+ control signal to shift its state, whereby S6 is opened. At the same time, the Δ2 control signal shifts state to open S2; and, the DE− control signal shifts state to close S4. As a result, $V_{REF1}$, the accurate positive reference voltage, is applied to the input of A1. After the output of A1 settles, which occurs during a third fixed period of time, S2 is closed by the Δ2 control signal again shifting state. At the same time, the counter 21 is enabled to count clock pulses. Thereafter, the controller 19 monitors the output of the transition detector 15 until a transition occurs. When a transition is detected, the controller disables the counter and the DE− control signal shifts state, whereby S4 is opened. Thereafter, the controller causes the storage memory 25 to read the output of the counter 21 by applying a WRITE control signal to the storage memory 25. As a result, the counter value 21 is transferred to the storage memory 25. The counter value is, of course, the correction multiplier used to correct the digital signal produced using $V_{REF2}$. In reality the counter value is related to the ratio between $V_{REF1}$ and $V_{REF2}$. After the counter value has been transferred to the storage memory, the AZ control signal produced by the controller 19 shifts state to cause S3 and S5 to close, whereby the auto-zero mode of operation of the dual slope A/D converter is entered. After the fixed delay period, the system recycles and a test is again made to determine whether it is time to update the storage memory.

FIG. 3 is a partially block and partially schematic diagram illustrating an embodiment of the invention that is bi-directional as well as bi-polar. More specifically, FIG. 3 illustrates a modification to the emdodiment of the invention illustrated in FIG. 1 that provides digital-to-analog conversion as well as analog-to-digital conversion. In this regard, the dual slope A/D converter 11 illustrated in FIG. 1 is modified and identified in FIG. 3 as an A/D-D/A converter 31. In addition, the embodiment of the invention illustrated in FIG. 3 includes: a reference circuit 13; a transition detector 15; a polarity detector 17; a counter 21; a clock 23; a storage memory 25; a multiplier 27; and, a display 29 similar to the similarly named components in FIG. 1. In addition, FIG. 3 includes a controller 33 modified so as to function in a slightly different manner than the controller 19 illustrated in FIG. 1. Finally, FIG. 3 includes an input register 35 and an OR gate 37.

Because of the similarity between the FIG. 1 and FIG. 3 embodiments of the invention, only the differences included in the FIG. 3 embodiment are hereinafter described. In this regard, the A/D-D/A converter 31 includes all of the components of the dual slope A/D converter 11 illustrated in FIG. 1 and previously described. These components are connected in the same manner and, thus, will not be redescribed here.

In addition to the components contained in the dual slope A/D converter 11, the A/D-D/A converter 31 includes two additional single pole-single throw switches designated S7 and S8; a capacitor designated C4; and, a gain amplifier designated A4. S8 is connected in series with R4 between the junction between R2 and R3 and the output of A1. S7 is connected between the junction between R2 and R3 and the input of A4. C4 is connected between the input of A4 and ground. The output of A4 is connected to an output terminal designated analog output.

The input register 35 is a digital register connected to an input terminal adapted to receive the digital input to be converted. While the input register is shown as receiving a serial digital input, the input register could be in the form of a parallel input register for use in environments where the digital input is in parallel, rather than serial, form. The parallel output of the input register 35 is connected to one input of the OR gate (which actually comprises a plurality of OR gates, one for each bit of the parallel digital signal). The parallel output of the counter 21, rather than being directly connected to the storage memory 25 is connected to a second input of the OR gate 37. The output of the OR gate 37 is connected to the data input of the storage register 25 and to a data input of the multiplier 27. The digital output of the multiplier 27, in addition to being connected to the input of the display 29 is also connected to the controller 33. Finally, the controller 33, in addition to the AZ, Δ2, DE−, DE+ and INT switch control signals also produces two additional switch control signals designated S/H and $\overline{S/H}$. S/H and $\overline{S/H}$ are, of course, complementary control signals. The S/H control signal is connected to control the state of S7 and the $\overline{S/H}$ control signal is connected to control the state of S8. Because S/H and $\overline{S/H}$ are complementary, when S8 is open, S7 is closed and vice versa.

In operation, when it is desired to convert an analog input to a digital signal, the A/D-D/A converter is controlled by the controller 33 in the same manner as the dual slope A/D converter 11 illustrated in FIG. 1 and previously described, the only difference being that S8 is, of course, closed so the R4 is connected in the circuit. Since S8 is closed, of course, S7 is open. As a result, the gain amplifier A4 is disconnected from the circuit. Since the operation of the A/D-D/A converter when converting an analog signal into a digital signal has been previously described, such operation is not shown in FIG. 4 and will not be redescribed here. Rather, FIG. 4 only illustrates the operation of the controller 33 when the A/D-D/A converter is converting a digital input into an analog signal, and the following description only describes this mode of operation.

Figure 4:
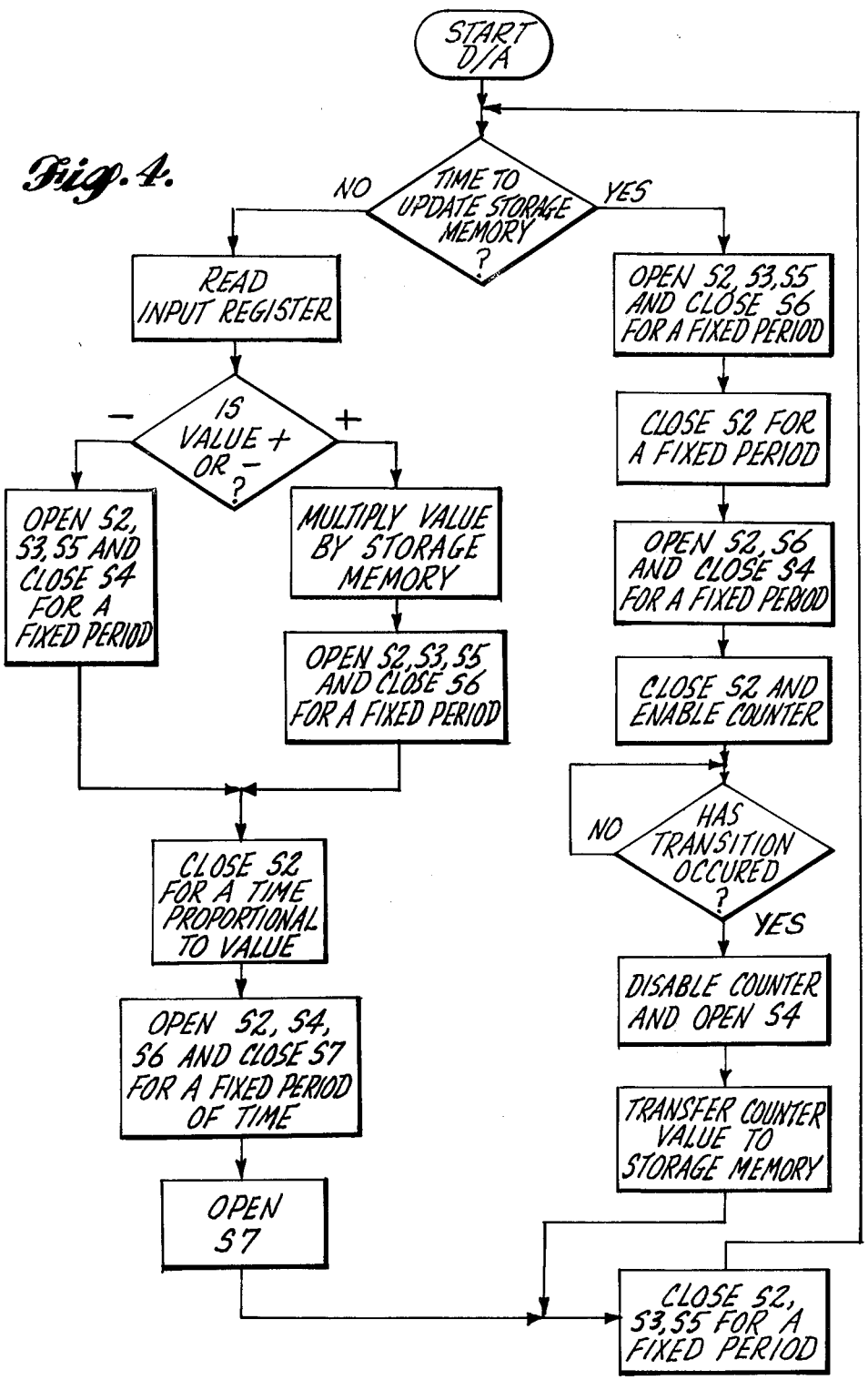

Turning now to FIG. 4, after the D/A conversion sequence has been started, the controller first determines if it is time to update the storage memory 25. If it is time to update the storage memory 25, a sequence of operation similar to the updating of the storage memory illustrated in FIG. 2 and previously described occurs. More specifically, first, S2, S3 and S5 are opened by the AZ and Δ2 control signals. At the same time, S6 is closed by the DE+ control signal. As a result, a negative reference voltage is applied to the input of A1. Since S2 is open, the output of A1, is not applied to the integrator. After a first fixed period of time adequate for the output of A1 to settle, S2 is closed by the Δ2 control signal. As a result, the integrator charges in a positive direction. At the end of a second fixed period of time, S2 and S6 are opened by the Δ2 and DE+ control signals. At the same time, S4 is closed by the DE− control signal. Since S2 is open, the output of A1 is not yet applied to the integrator. After a third fixed period of time, adequate for the output of A1 to again settle, S2 is again closed by the Δ2 control signal. At the same time, the counter 21 is enabled by the controller 33. Thereafter, the controller continuously monitors the output of the transition detector 15 to detect when a transition occurs. When a transition occurs, i.e., the output of the integrator has been discharged to zero, the counter 21 is disabled. At the same time, S4 is opened by the DE− control signal. As before, the count value in the counter 21 is directly related to the ratio between $V_{REF2}$, the inaccurate reference, and $V_{REF1}$, the accurate reference. This count value is transferred to the storage memory 25 via the OR gate 37. Thereafter, S2, S3 and S5 are closed by the controller for a further fixed period of time, during which auto-zeroing of the system occurs.

If the controller determines that it is not time to update the storage memory, after the start of the D/A conversion sequence, the controller reads the value in the input register. This result may be accomplished by the controller directly reading the output of the input register 35 or by the controller transferring the input register value to the multiplier 27 via the OR gate 37 and, then, reading the output of the multiplier 27. In either case, the controller determines whether or not the digital value to be converted is a positive or negative value. If the value is a negative value, the controller opens S2, S3 and S5 via control signals AZ and Δ2. At the same time, S4 is closed by the DE− control signal. S4 remains closed for a first fixed period of time during which $V_{REF1}$ is applied to the input of A1. The first fixed period of time is a period of time during which the output of A1 settles. Contrariwise, if the controller determines that the digital signal is a positive signal, prior to opening S2, S3 and S5, and closing S6, the signal in the multiplier is multiplied by the storage memory value 25, which, as previously described, is directly related to the error of the inaccurate voltage $V_{REF2}$. After the digital value has been so "corrected", the controller opens S2, S3 and S5 via control signals AZ and Δ2. At the same time S6 is closed via control signal DE+. As a result, $V_{REF2}$, rather than $V_{REF1}$ is applied to the input of A1. After the settling period of time has elapsed, regardless of whether $V_{REF1}$ or $V_{REF2}$ is applied to the input of A1, S2 is closed by the Δ2 control signal. S2 remains closed for a period of time proportional to the digital input value, during which C1 is charged for a time proportional to the value of the digital input to be converted. That is, the output of the multiplier 27 via the controller determines the period of time during which S2 is closed. During this period of time the integrator capacitor C1 charges in a polarity direction determined by the positive/negative nature of the digital signal. At the end of the proportional period of time, the controller opens S2, S4 and S6 via the Δ2, DE+ and DE− control signals. At the same time S7 is closed by the S/H control signal. When S/H closes S7, S/H opens S8, since S/H and S/H are complimentary control signals. When S/H is closed, a charge is transferred to C4 so that the voltage on C4 equals the output voltage of A2. After the period of time adequate for the voltage to stabilize, S7 is opened. At this time, the output of A4 is an analog signal equal in polarity and magnitude to the polarity and magnitude of the digital input originally stored in the input register 35. After S7 is opened, S2, S3 and S5 are again closed by the Δ2 and AZ control signals and the auto-zero mode of operation occurs. Thereafter, the system recycles.

As will be readily appreciated from the foregoing description, the invention provides an apparatus that eliminates the need for two accurate reference voltage sources in bi-polar electronic converters that previously required two accurate reference sources. The invention eliminates this requirement by comparing a single accurate reference source with an inaccurate reference source of opposite polarity and storing information about the error of the inaccurate reference source. The error information is later used when the inaccurate reference source is utilized in the conversion of a signal from one form to another form to eliminate conversion errors resulting from the inaccurate reference voltage error. While the invention has been described for use in analog-to-digital and digital-to-analog converters, it will be readily appreciated that the invention can be utilized in other types of electronic conversion systems requiring highly accurate bi-polar voltage sources. Consequently, the invention can be practiced otherwise than as specifically described herein.

The embodiments of the invention in which an exclusive property or privilege is claimed are defined as follows:

1. In a bi-polar electronic conversion system including reference sources of opposite polarity for use in converting electronic signals from one form to another form, the improvement comprising:
   (a) an accurate reference source of one polarity;
   (b) an inaccurate reference source of polarity opposite to the polarity of said accurate reference source; and,
   (c) electronic means for:
      (1) comparing said accurate and said inaccurate reference sources to determine the inaccuracy of said inaccurate reference source; and,
      (2) using the results of said comparison to correct electronic signals, converted from one form to another form using said inaccurate reference source, during the conversion of said electronic signals from said one form to said other form.

2. The improvement claimed in claim 1 wherein said accurate and said inaccurate reference sources are voltage sources.

3. In a bi-polar, bi-directional electronic conversion system for converting electronic signals from a first form to a second form and vice versa, including reference sources of opposite polarity for use in converting said electronic signals from one form to another form and vice versa, the improvement comprising:
   (a) an accurate reference source of one polarity;
   (b) an inaccurate reference source of polarity opposite to the polarity of said accurate reference source; and,
   (c) electronic means for:
      (1) comparing said accurate and said inaccurate reference sources to determine the inaccuracy of said inaccurate reference source; and,
      (2) using the results of said comparison to correct electronic signals, converted from one form to another form and vice versa using said inaccurate reference source, during the conversion of said electronic signals from said one form to said other form and vice versa.

4. The improvement claimed in claim 3 wherein said accurate and said inaccurate reference sources are voltage sources.

5. In a bi-directional, ratiometric analog-to-digital converter wherein the analog signal to be converted is ratio compared to a reference source of polarity opposite to the polarity of the analog signal to be converted, the improvement comprising:
   (a) an accurate reference source of one polarity;
   (b) an inaccurate reference source of polarity opposite to the polarity of said accurate reference source; and,
   (c) electronic means for:
      (1) periodically comparing said accurate and said inaccurate reference sources to determine the inaccuracy of said reference source;
      (2) storing the results of said comparison; and,
      (3) using the stored results of said comparison to correct analog-to-digital conversions using said inaccurate reference source.

6. The improvement claimed in claim 5 wherein said accurate and said inaccurate reference sources are voltage sources.

7. The improvement claimed in claim 6 wherein said periodic comparison of said accurate and said inaccurate reference sources produce a correction multiplier and wherein the digital signal resulting from an analog-to-digital conversion using said inaccurate reference source is multiplied by said correction multiplier to produce an accurate digital representation of the original analog signal to be converted.

* * * * *